Jan. 13, 1970 HISAYOSHI YANAI ET AL 3,489,956

SEMICONDUCTOR DEVICE CONTAINER

Filed April 27, 1967

INVENTORS
HISAYOSHI YANAI
HUMIKO KIDA
TAKAYUKI YANAGAWA
ISAO TSUBAKI
Hopgood & Calimafde
ATTORNEYS United States Patent Office 3,489,956
Patented Jan. 13, 1970

3,489,956
SEMICONDUCTOR DEVICE CONTAINER

Hisayoshi Yanai, Humiko Kida, and Takayuki Yanagawa, Tokyo, and Isao Tsubaki, Chiba-ken, Japan, assignors to Nippon Electric Company Limited, Tokyo, Japan Filed Apr. 27, 1967, Ser. No. 634,186
Claims priority, application Japan, Sept. 30, 1966, 41/64,559
Int. Cl. H01l 5/06
U.S. Cl. 317—234 7 Claims

ABSTRACT OF THE DISCLOSURE

A generally flat type container structure with improved high frequency characteristics for enclosing a semiconductor device. The structure includes a metallic main body portion for mounting the semiconductor device thereon and a cover sealed to the main body portion. A signal conductor, a common conductor and a ground conductor are also provided as a part of the structure with the common conductor integral with the main body portion.

BACKGROUND OF THE INVENTION

As those knowledgeable in the art are aware, semiconductor devices such as diodes, transistors, and integrated circuits are normally not used in the form of the semiconductor elements per se, and for the reasons of convenience in handling and to avoid the deleterious effects of the atmosphere, most commonly they are placed in airtight or sealed containers. Up to the present time, as to the transistor container, cylindrical containers made of metal or resin with lead wires from one end extending perpendicular thereto have been widely used. In the case of semiconductor devices sealed in an airtight container, the electrical signal is fed to the semiconductor element by way of the terminals which form a part of the container or by leads passing therethrough. Consequently, when the semiconductor devices are used in the high frequency region (at higher than the VHF band, for example), the effects of parasitic elements such as lead wires and caps attached to containers markedly disturb the function of the semiconductor element. Such disturbances cause a number of difficulties as, for example, the electrical signal not being impressed or the semiconductor element effectively or the device failing to provide an output, signal delays, generation of unwanted oscillations or resonance, and so forth. These disturbances result from the inductance of the terminal leads, the resistance caused by skin effect at the high frequencies, static capacitance between the terminal leads and the ground capacity of the terminals.

Furthermore, the conventional cylindrical container is suitable for use only up to approximately several gigahertz (gHz.) at best. As opposed to this, there exist transistors whose theoretical maximum oscillating frequency extends higher than 10 gHz. Consequently, the high frequency characteristics of semiconductor devices are more often limited by the characteristics of the container rather than by the characteristics of the semiconductor elements.

Various forms of transmission lines are suitable for carrying high frequency electrical signals, such as waveguides, coaxial lines and strip lines. As to the containers for semiconductor devices, they should desirably possess a structure which is capable of transmitting a signal to the semiconductor element placed therein by faithfully relaying the given transmission line and external circuit characteristics, and to date a number of containers designed for the said three varieties of conventional transmission line systems have been reported. Among these are a "strip line" type of device which comprises a signal transmitting conductor in the form of a flat strip or band and a grounded conductor facing the signal transmitting conductor with a dielectric layer interposed between the two conductors. This form can easily be fabricated as a print substrate or thin film circuit, hence it is used in a comparatively large number of cases. Further, a strip line container used for a semiconductor is characterized by such advantages as being relatively easy to manufacture compared to other types and can be made at less cost, in miniature form and light in weight. As one example of a transistor container for the conventional strip line, there is a type in which the semiconductor element storing section is built almost flat, with terminal leads in strip form extended in the same plane that contains the flat storing section. This type is referred to hereinafter as a flat type container.

In the explanation of the strip line referred to above, one conductor in the pair for transmission of electrical signals which is made into strip form is known as a signal transmitting conductor (hereinafter simply called a signal conductor), and the other conductor is called a grounded or ground conductor. However, in semiconductor devices the potential of the said other conductor (ground conductor) which with the signal conductor forms a pair, is not necessarily maintained at the ground potential of the electronic device used, but is more often used with "AC grounding." "AC grounding" means that it is grounded for AC, i.e., it is connected to ground potential through a static capacitor whose impedance can, for practical purposes, be ignored in the frequency region used. As a result, as regards the container for semiconductor devices, it is generally convenient in more cases to provide a third conductor which is maintained at ground potential for the container itself in addition to the conductor which forms a pair with the signal conductor.

In the case of three terminal semiconductor devices, such as the transistor, the conductor which forms a pair with the signal conductor for the input and the output is used in common by the input and the output. For example, in the case of an emitter-grounded transistor amplifier circuit, its input signal is applied across the base-emitter, and the output signal is taken from across the collector-emitter. Normally, the conductors connected to the base and collector are called the input and output conductor respectively, while the conductor connected to the emitter is called the common conductor because it is used in common by both the input and the output. In this manner the third conductor which is maintained at the same potential with the grounded point is called the ground conductor to designate it separately. In the description which follows, similar terminology will will be employed, i.e., the conductor paired with the signal conductor will be called the common conductor and the third conductor maintained at ground potential will be referred to as the ground conductor.

Desirable conditions or requirements of the container housing for semiconductor devices for use in the high frequency (HF) region are as follows:

(1) The characteristic impedance of each signal conductor leading from the outer wall of the container to the semiconductor element should be uniform as possible and matched to the external circuit.

(2) The plurality of signal conductors required should be mutually shielded electrostatically as well as electromagnetically.

(3) The container interior should be shielded from the outer surroundings both electrostatically and electromagnetically.

(4) Both the common conductor and the ground conductor should have low impedance.

(5) The common conductor should be grounded for AC in the container interior with respect to the ground conductor.

Although the conventional flat type container is small in size compared to the cylindrical container, its parasitic element impedance is reduced, and it possesses an improved high frequency characteristic, nevertheless, it does not satisfy all five conditions. As to other flat type containers of conventional type, none of these satisfies all five requirements either.

OBJECTS OF THE INVENTION

It is one object of this invention to provide a sealed container structure for semiconductor devices having high frequency characteristics that are significantly improved over those obtainable with prior art structures and which also fulfills the requirements set forth above.

All of the objects, features and advantages of this invention and the manner of attaining them will become more apparent and the invention itself will be best understood by reference to the following description of the invention taken in conjunction with the accompanying drawing.

GENERAL SUMMARY OF THE INVENTION

Figures 1A, 1B, 3, 4:
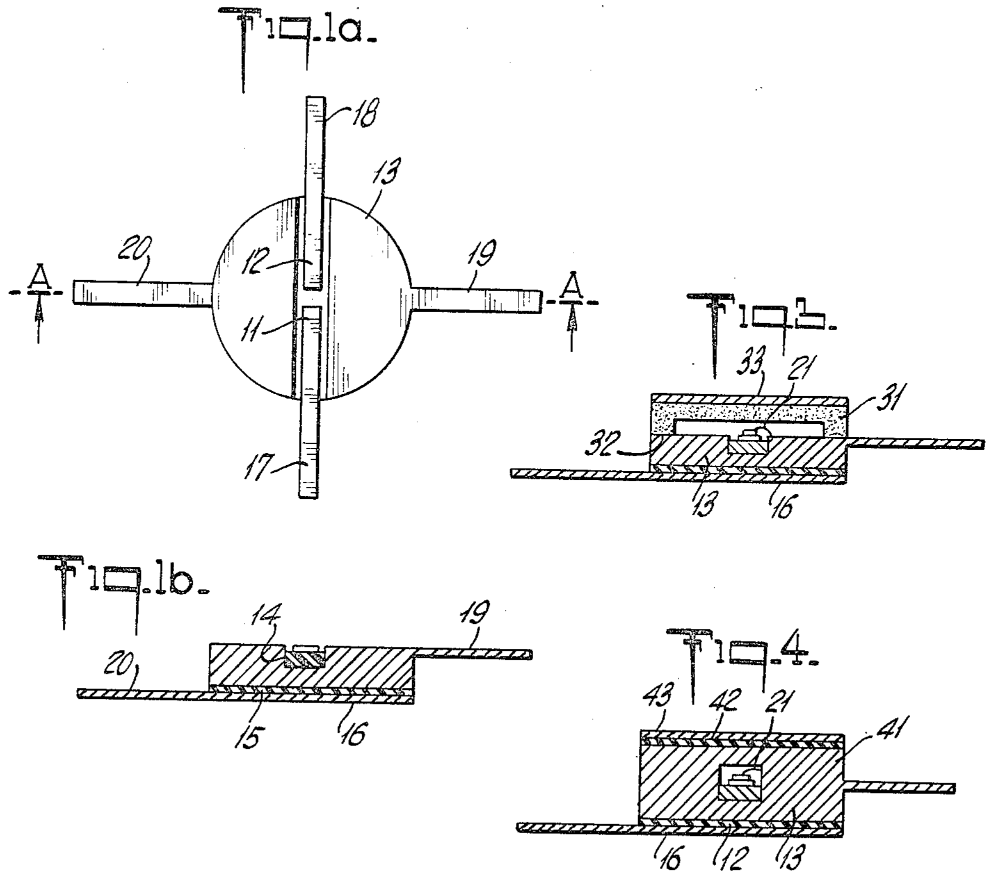
FIGS. 1*a* and 1*b* are a plan view and a side view, respectively, of one embodiment of this invention.

The invention according to one embodiment may comprise a flat type container structure for semiconductor devices characterized in that a semiconductor element mounting or storage section is provided in the form of substantially a flat plate, and possesses a plurality of terminal leads, is generally flat in cross-section, of strip form, and extends in the same plane which contains the said flat plate form storage section. The structure is further characterized by having signal conductors, a common conductor, and a ground conductor, the signal conductors being constructed in strip form and bonded onto one surface of a first dielectric layer, the common conductor comprising a metallic main body portion bonded to substantially the entire surface of the first dielectric layer except the surface to which the signal conductors are bonded, said first dielectric layer being in a channel or slot in said main body portion, and the ground conductor being on at least one surface substantially in the flat plate form of the container and being further bonded to the common conductor by a second dielectric layer.

According to a further embodiment, the invention may comprise a semiconductor device flat form container characterized in that a semiconductor element mounting or storage section is provided in the form of substantially a flat plate, and possesses a plurality of terminal leads extending in the same plane which contains the flat plate form storage section. The structure is further characterized by having signal conductors and a common conductor which is held at ground potential when in use, the signal conductors being constructed in strip form and bonded onto one surface of a dielectric layer having two surfaces in parallel, and the common conductor being bonded on the entire surface of the dielectric layer except for the surface onto which the signal conductors are bonded.

Further, the flat type container of this invention may comprise a signal conductor, a common conductor, and a ground conductor, the signal conductor being made in strip form of generally uniform width and coated on one surface of a dielectric layer having two parallel surfaces, the common conductor coating the entire surface of the dielectric layer with the exception of the surface coated with the signal conductor and the surface appearing at the outer wall of the container, and the ground conductor being at one surface of the container and coated over the common conductor with a discrete dielectric layer therebetween. In the particular case of AC grounding where the common conductor and the ground conductor are at the same potential, there is no need to provide an extra dielectric layer between the ground conductor and common conductor. Instead, either the common conductor could be used as a ground conductor or the two conductors could be shorted at the interior of the container or at the container exterior around the dielectric layer existing between the ground and common conductors.

In the majority of cases, the characteristic impedance of a strip line is determined by the width and thickness of the signal conductor and by the properties and the thickness of the dielectric layer. The theoretical value for the characteristic impedance has only been obtained to date for the case of the ground conductor and a dielectric having an infinite magnitude of expansion, and for other cases it had to be determined experimentally. However, as in the case of this invention where the signal conductor is made in strip form and the dielectric thickness is made uniform, the characteristic impedance could be made uniform over the entire line. Further, if feasible, it is better to adjust the value of characteristic impedance by varying the width of the signal conductor within the dielectric thickness. Thus it will be seen that the #1 condition stated above is satisfied.

Moreover, with this invention in a structure comprising a plurality of signal conductors surrounded by the common conductor with the dielectric layer interposed, the signal conductors are electrostatically shielded from one another. From this viewpoint it is desirable that the common conductor be located as close as possible to both side surfaces of the signal conductor. When the common conductor is located close to the side surfaces of the signal conductor, the characteristic impedance of the signal conductor can be considered variable. However, it was confirmed by the inventors that within the practical range of materials and dimensions employed, even if their spacing at the side surface is made sufficiently narrow (for example, of the order of 0.1 millimeter), the characteristic impedance of the signal conductor does not vary markedly. Even though the variations of the characteristic impedance cannot be ignored, in the case of the container construction of this invention, it is apparent that the value of the characteristic impedance of the signal conductor can be set at a uniform and random value by varying the width of the signal conductor or the thickness of the dielectric. In general, in high frequency usage, electrostatic shielding alone will sufficiently serve the purpose in the majority of cases, however, electromagnetic shielding is also possible by making the common conductor of a high permeability ferromagnetic substance. Thus the desirable condition #2 recited above is also satisfied.

Furthermore, with this invention, when the signal conductors are surrounded by the common conductor which is grounded for A through the dielectric layer by the ground conductor attached to the outer surface of the container and which are disposed on the dielectric layer flush with the signal conductors, the signal conductors positioned inside the container can be shielded electrostatically from the exterior and can also be electromagnetically shielded, if necessary, by the common or ground conductor made of a ferromagnetic conductor material. This will satisfy condition #3 set forth above.

Moreover, while the undesirable inductance attributable to the common conductor and the ground conductor can be substantially eliminated in arrangements where the common conductor and the ground conductor are made of thin wires or are in strip form, in the case of the present invention, although these conductors cover a wide area, such inductance can nevertheless be reduced, as will appear. This will satisfy condition #4 recited above.

Still further, it is feasible with this invention, wherein the common and the grounded conductors are positioned face to face with the interposed dielectric layer forming an electrosatic capacity between these two conductors, to ground for AC inside the container by means of grounding the common conductor. This will satisfy condition #5.

As a consequence, it is feasible, corresponding to the conventional AC grounding of the common conductor accomplished by attaching a capacitor to the outer side of the container, to simplify the circuitry without using such additional capacitor with the resultant adverse effect caused by the inductance of the lead wires attached to the capacitor and other parasitic members. Furthermore, the value of the ground capacitance can be varied by adjusting the area in which the common conductor and the ground conductor stand in opposition, the thickness of the dielectric layer, and the dielectric constant. If, however, the capacitance of this portion is insufficient, the additional amount required can be provided across the common conductor and the ground conductor by attaching it to the outer side of the container. Even in such case the static capacity obtained by connection to the outer side of the container could be smaller than that needed in conventional practice, and in addition, the influence of parasitic elements can be considerably varied.

Furthermore, the common conductor and the ground conductor can be used in a shunted manner and this can be considered an AC ground in a broad sense. Even if these two conductors are shunted with a conductor at the exterior of the container, the influence of the inductance of the shunt conductor need not be considered since the common conductor is grounded for AC within the container according to the construction of the container in accordance with this invention. Though such be the case, in order that the time necessary for the shunting operation may be saved, it is recommended that such shunting be done at the container interior or at least at one point on the exterior wall of the dielectric layer sandwiched between the common conductor and the ground conductor. Alternatively, the common conductor may be used as a ground conductor by removing the ground conductor and the dielectric layer annexed to it.

DETAILED DESCRIPTION OF PREFERRED EMBODIMENTS

Referring to FIGS. 1*a* and 1*b*, an input signal conductor 11 and an output signal conductor 12 in the form of strips of uniform width are arranged in a straight line on the surface of a dielectric layer 14 of narrow and long rectangular shape placed in a slot or channel at the center of a common conductor 13 shaped in a form of circular plate. These conductors 11 and 12 are bonded to the layer 14 and are spaced equidistant from the common conductor 13. The common conductor plate 13 has a continuous upper face surface except for the slot provided for the dielectric layer 14 upon which the signal conductors 11 and 12 are bonded. The opposite or lower face of the common conductor 13 is provided with a ground conductor 16 in the form of flat plate which is bonded to the common conductor plate 13 by a separate thin film dielectric layer 15. Provided at the outer side of the circular plate container thus described are terminal lead conductor ends in strip form, including input terminal 17, output terminal 18, common terminal 19, and ground terminal 20, which serve to connect to exterior strip lines. In the embodiment of FIGS. 1*a* and 1*b*, strip lead 20 is connected to the ground conductor 16, and it is desirable practice from the standpoint of heat sink considerations to bond tightly with the other grounding conductors by soldering the entire surface of the ground conductor 16. In the embodiment of the container having the structure of FIGS. 1*a* and 1*b*, it is preferable to use non-oxidized copper of 0.08 mm. thickness for the signal conductors 11 and 12, and steatite for the dielectric layer 14 (having a specific inductive capacity of approximately 6 and a specific permeability of approximately 1).

It was confirmed by experiments that for a width of the signal conductors 11 and 12 of 0.60 millimeter and a thickness of the dielectric layer 14 of 0.41 millimeter, the structure will have a characteristic impedance of 50Ω. These dimensions are fully practical and realizable for actual manufacture. It was further confirmed by our experiments that at the side faces of the signal conductors 11 and 12 on the surface of the dielectric layer 14, even if the common conductor 13 is brought as close as 0.1 millimeter to that surface, there was hardly any variation in the 50Ω characteristic impedance produced by the above combination of dimensions. In addition, it was also confirmed that an increase in the thickness of the signal conductors 11 and 12 to approximately 2 times the 0.08 millimeter figure did not produce any variation in the characteristic impedance. Since the common conductor 13 is so arranged as to embrace the signal conductors 11 and 12, these latter conductors 11 and 12 are fully isolated from each other. Also, positioning the common conductor at the portion where the two signal conductors 11 and 12 are located in opposition in the container center improves their shielding effect. The common conductor 13 and the ground conductor 16 are in circular disk form, and this serves to reduce inductance compared to using them in the form of thin and long strips as for example in the shape of the terminal leads 19 and 20. The disk shaped common conductor 13 and the ground conductor 16, together with the layer 15, form a static condenser with the common conductor 13 grounded for AC within the container.

Figure 2:
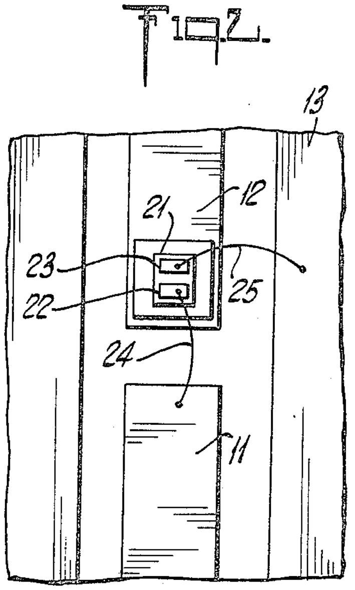
FIG. 2 is a top view illustrating a means and method for mounting transistors in the container of the embodiment of FIG. 1, FIGS. 3 and 4 are cross-section views showing respectively an insulated and a conductive cover for the container of FIG. 1

Next, the mounting of the semiconductor element per se in the container of FIGS. 1*a* and 1*b* followed by interior wiring will be explained with the aid of FIG. 2. FIG. 2 is an embodiment showing an enlarged view of the center portion of the container of FIGS. 1*a* and 1*b* upon which is mounted an impurity diffused type transistor pellet 21 wired to be used as an emitter-grounded circuit. As noted above, in the case of an emitter grounded circuit, the base is the input, the collector the output, and the emitter is grounded with the common terminal. Also, on one face of the transistor pellet 21, there are formed in conventional manner, base and emitter electrodes 22 and 23 respectively, and on the opposite face a collector electrode (not shown) is likewise formed. The connection between the collector electrode and the output conductor 12 is completed by alloying the face of the collector electrode onto this output conductor, as is common practice in the fabrication of impurity diffusion type transistors. The connections of the base electrode 22 with the input conductor 11, and of the emitter electrode 23 with the common conductor 13, are made using thin conductor wires 24 and 25 of gold or aluminum by the thermal pressure bonding method. To perform welding of the transistor pellet 21 and thermal pressure bonding of the thin conductors 24 and 25, it is desirable that the input, output and common conductors 11, 12 and 13 be coated with a thin layer of gold. The use of thin conductors in the interior wiring is not a desirable practice from the standpoint of obtaining maximum reduction of inductance, however, this invention is concerned primarily with the structure of the container, and suitable techniques for such reduction are known to those skilled in the art and can be easily applied to this structure.

As to the method of bonding a conductor to a dielectric layer such as ceramic, for example, there is one known method utilizing glass as a bonding medium. By this method, clean surfaces of steatite and nonoxidized copper are pressure bonded embracing between them a plate of soda glass (having a dielectric constant nearly equal to that of steatite) of approximately 0.12 millimeter thickness; this is then left at a temperature generally between 950° C. and 980° C. for 10 minutes, during which time the soda glass melts, thus bonding the steatite and the copper plate. The thickness of the residual glass plate between these two elements depends upon the pressure employed and can be made less than 0.1 millimeter, the presence of which can be almost ignored. Other suitable conductor materials for this bonding method, include chromium-iron-nickel 426 alloy and iron-nickel 52 alloy that is chromium plated. Various dielectric materials such as beryllia ceramic, spinel ceramic, alumina ceramic and others may also be used. For the bonding of the dielectric layer to the conductor layer, other methods than the above such as the conventional methods of vacuum evaporation, sputtering, or sintering can also be used. In such case the terminal leads for connecting the external circuits must be bonded separately.

The fixing of the semiconductor pellet and the wiring of the interior are normally followed by airtight sealing of the structure. According to our experiments, it was confirmed that even in the case where a dielectric layer of the same material as the dielectric substrate below was deposited onto the signal conductor, the slight variations of characteristic impedance could be ignored as a practical matter. Consequently, airtight sealing of the container shown in the embodiment of FIGS. 1*a* and 1*b* can be accomplished in the same manner as that used for conventional "Microdisk" (commercial name) type semiconductors such as shown in FIG. 3.

FIG. 3 shows a cross-sectional view taken along line A—A of the container shown in FIG. 1*a* with a suitable cover 31 added to provide an airtight seal. In this figure, the cover 31 is made of steatite, having a hollow portion at the center and a periphery approximately equal to that of the common conductor 13 and is bonded to the face thereof on which the semiconductor pellet 21 is mounted. A low melting point glass coating is sintered on the periphery 32 of the cover 31 in a previous operation, after which the cover is pressure-bonded to secure the same to the common conductor 13, and then the resulting unit is processed through a furnace at a temperature higher than the melting point of the glass coating, thus accomplishing the airtight seal. In the embodiment of FIG. 3, a separate grounded conductor 33 is also provided on the outer face of the steatite cover 31. The two ground conductors 16 and 33 are shorted by suitable shorting means, such as a wire (not shown) so that they will assume the same potential, and by this means more effective shielding of the container interior is achieved.

FIG. 4 is another cross-sectional view taken along line A—A of the container shown in FIG. 1*a*, but with the addition of a different cover 41 than that employed in FIG. 3 to provide an airtight seal. The cover 41 is made of a conductive material that is bonded to the common conductor 13 and is therefore at the same potential as this conductor. A hollow recess is provided at the center of the cover 41 to accommodate the semiconductor pellet 21. With this construction, the shielding between the signal conductors 11 and 12 and also between the signal conductors and the exterior is improved over the shielding provided by the structure of FIG. 3. Moreover, the heat sink characteristics of this embodiment are also improved, resulting in a lower operating temperature for the semiconductor pellet 21. Additionally, according to the embodiment of FIG. 4, a ground conductor 43 is bonded, by means of another dielectric thin film 42, on the surface of the conductive cover 41, thus serving to enhance the static capacitance between the common conductors 13, 41 and the ground conductors 16, 43. The two ground conductors 16 and 43 are of course shorted by any suitable means, such as for example, wires (not shown). The airtight structure need not be restricted to the two embodiments shown in FIGS. 3 and 4, but other structures and methods, for example, the casting method using resin, may also be employed. Depending upon the method of airtight sealing employed, the characteristic impedance value of the signal conductor may be influenced but such effect can be compensated for by having the characteristic impedance value shifted by a predetermined amount prior to the airtight sealing. Furthermore, the thickness of each conductor, and the spacings employed can be selected depending upon the impedance of the transmission line used.

Figure 5:
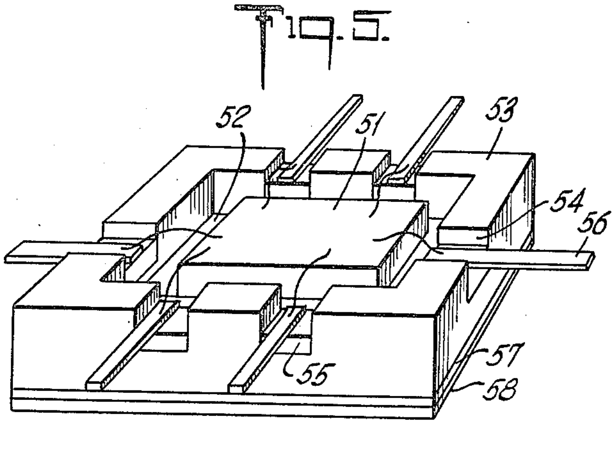
FIG. 5 is a view illustrating a further embodiment of this invention.

Referring now to FIG. 5, a third embodiment of this invention is shown and comprises a solid state semiconductor device having a cavity 52 in one surface to accommodate a solid state semiconductor integrated circuit element 51. A common conductor 53 is provided with slots 54 communicating with the cavity 52 cover and through the outer wall of this common conductor. A first dielectric layer, having portions 55, is bonded to the conductor 53 in the slots 54. Lead-out conductors 56 are provided on the dielectric layer 55 and are spaced at an approximately constant gap distance from the common conductor 53. A ground conductor 58 is bonded to the lower surface of the common conductor 53 by means of a second dielectric layer 57. This solid state semiconductor device can be made to possess excellent heat sink characteristics by bonding the elements directly onto the common conductor 53. A ruggedized structure with superior shielding properties can also be achieved by covering the solid state or semiconductor device with a metallic lid and by sealing the conductor lead-out slots with an airtight sealing medium. Furthermore, the said second dielectric layer and ground conductor need not be provided when the common conductor is used at DC ground potential, since fixing the common conductor directly onto the circuit substrate is feasible for such use.

One important advantage derived from the container structures described in the embodiments above is that the heat sink capacity of the device is significantly improved because the semiconductor is bonded to a flat portion mounted on the ground conductor, and this portion is closely bonded or soldered onto the grounded conductor to provide maximum heat transfer. In the above embodiments the signal conductors are shown as linear and are arranged in linear formation, however, it has been confirmed by experiments that even where the signal conductors are bent at right angles on the dielectric layers, variations of characteristic impedance are practically negligible. Accordingly, the shape and arrangement of the signal conductors can be varied as desired, within practical limits. Moreover, the shape of the container is not restricted to circular form as shown in several of the embodiments described. Further, as to the type of semiconductor device, it is apparent that this invention is applicable to many types of such devices including field effect and other transistors, integrated circuits and other varieties of semiconductor devices. Furthermore, the above embodiments demonstrate arrangements where one signal conductor is used for the input and one for the output, however, the advantage of this invention can be realized for devices which employ only one signal conductor, or more than three conductors as in integrated circuits.

While the foregoing description sets forth the principles of the invention in connection with specific apparatus, it is to be understood that the description is made only by way of example and not as a limitation of the scope of the invention as set forth in the objects thereof and in the accompanying claims.

What is claimed is:

1. A container and semiconductor element mounted therein for use with a microwave strip transmission line comprising:

a conductive body having a slot formed therein for impedance matching to the microwave strip transmission line, a dielectric layer placed on the bottom of the slot, a first signal conductor positioned in the slot over the dielectric layer and electrically isolated from the conductive body, with said dielectric layer and first signal conductor being sized to establish a characteristic impedance for matching to the strip transmission line, and a semiconductor element recess mounted in said conductive body, said semiconductor element being provided with electrode leads for selective electrical connection to the first signal conductor and the conductive body.

2. The device as recited in claim 2 wherein the conductive body is flat shaped with the slot formed in a first surface of the conductive body, a thin second dielectric layer formed over a second surface of the body and located opposite said first surface, a ground conductor formed over the second dielectric layer and the second conductive body surface, said ground conductor being A.C. coupled to the conductive body.

3. The device as recited in claim 2 wherein the slot spans across the entire conductive body and wherein said dielectric layer is substantially coextensive with said slot, a second signal conductor positioned in the slot and over the dielectric layer and electrically isolated from the conductive body, said first and second signal conductors terminating within the slot opposite one another separated by a gap, and wherein the second signal conductor and the dielectric layer are sized to establish a selected characteristic impedance, with said semiconductor element mounted within the slot in electrical contact with the second signal conductor.

4. The device as recited in claim 2 wherein the conductive body is substantially circularly disc shaped with the slot aligned along a diagonal of the disc shaped body.

5. The device as recited in claim 2 and further including a conductive cover placed over the slot in conductive contact with the body.

6. The device as recited in claim 4 wherein the conductive body including the cover form a substantially flat shaped assembly, additional dielectric layers formed over both oppositely located surfaces of the assembly, and a pair of ground conductor layers formed over the additional dielectric layers, said ground conductor layers being A.C. coupled to the conductive body.

7. A container structure for a semiconductor for use with microwave transmission lines comprising a generally flat conductive body having a recess in a surface, a semiconductor element mounted within the recess of the conductive body, said conductive body being provided with a plurality of slots in said one surface for transmission line coupling between the recess and the periphery of the conductive body, dielectric layers formed in said slots, signal conductors formed on said dielectric layers, said signal conductors and dielectric layers being sized to establish selected characteristic impedances for matching to microwave transmission lines, with said semiconductor element being provided with electrode leads for selective electrical connection to the signal conductors.

References Cited

UNITED STATES PATENTS

| | | | |
|---|---|---|---|
| 3,171,187 | 3/1965 | Ikeda et al. | 29—25.3 |
| 3,271,634 | 9/1966 | Hecton | 317—234 |
| 3,320,353 | 5/1967 | Smith | 174—52 |
| 3,144,366 | 8/1964 | Rideout et al. | 148—179 |
| 3,249,683 | 5/1966 | Briggs et al. | 174—50.56 |
| 3,264,712 | 8/1966 | Hagashi et al. | 29—155.5 |

JOHN W. HUCKERT, Primary Examiner

S. BRODER, Assistant Examiner

UNITED STATES PATENT OFFICE
CERTIFICATE OF CORRECTION

Patent No. 3,489,956 January 13, 1970

Hisayoshi Yanai et al.

It is certified that error appears in the above identified patent and that said Letters Patent are hereby corrected as shown below:

Column 9, lines 13 and 23, for the claim reference numeral "2", each occurrence, should read -- 1 --; lines 35 and 38, for the claim reference numeral "2", each occurrence, should read -- 3 --. Column 10, line 1, for the claim reference numeral "4" should read -- 5 --.

Signed and sealed this 10th day of November 1970.

(SEAL)
Attest:

Edward M. Fletcher, Jr.
Attesting Officer

WILLIAM E. SCHUYLER, JR.
Commissioner of Patents